(12) United States Patent
Kamata et al.

(10) Patent No.: US 6,520,999 B1
(45) Date of Patent: Feb. 18, 2003

(54) METHOD OF DYEING PLASTIC LENS AND A DYEING SYSTEM USED THEREIN

(75) Inventors: Kenichi Kamata, Kyoto; Minoru Inuduka, Aichi; Tetsuo Yamada, Nagoya, all of (JP)

(73) Assignee: Nidek Co., Ltd., Aichi (JP)

( * ) Notice: Subject to any disclaimer, the term of this patent is extended or adjusted under 35 U.S.C. 154(b) by 0 days.

(21) Appl. No.: 09/384,057

(22) Filed: Aug. 26, 1999

(30) Foreign Application Priority Data

| Aug. 27, 1998 | (JP) | 10-241323 |
| Jun. 14, 1999 | (JP) | 11-166204 |
| Jun. 16, 1999 | (JP) | 11-169173 |

(51) Int. Cl.⁷ .............. D06F 5/28; B41N 3/12
(52) U.S. Cl. .............. 8/471; 427/162; 156/240
(58) Field of Search .......... 8/471, 506; 427/162; 156/240

(56) References Cited

U.S. PATENT DOCUMENTS

| 3,800,738 A | 4/1974 | Tassara |
| 5,302,223 A | * 4/1994 | Hale |

FOREIGN PATENT DOCUMENTS

| FR | 2088376 | 5/1971 |
| JP | 1-229885 | 9/1989 |
| JP | 1-277814 | * 11/1989 |
| JP | 7-168141 | 7/1995 |
| JP | 8-20076 | 1/1996 |
| JP | 2000-329901 | 11/2000 |

OTHER PUBLICATIONS

Patent Abstracts of Japan, vol. 014, No. 048, Jan. 29, 1990, JP 01–277814.
Patent Abstracts of Japan, vol. 1996, No. 6, Jun. 28, 1996, JP 08–043603A.
XP002132384, Database WPI, Derwent Publications Ltd., London of JP 2023314 A Dec. 1990.

* cited by examiner

*Primary Examiner*—Margaret Einsmann
(74) *Attorney, Agent, or Firm*—Finnegan, Henderson, Farabow, Garrett & Dunner, L.L.P.

(57) ABSTRACT

A method and system for dyeing a plastic lens by printing a colored layer (2) on a print base body (3) with a dyeing solvent by using a printer (5) electrically controlled, the dyeing solvent containing a dissolved or fine-grained dispersed sublimatable dye, then, placing the print base body having the colored layer in a position where the colored layer faces a plastic lens (14) to be dyed without contact therewith, and heating the print base body in a vacuum to sublimate the dye from the colored layer and deposit the sublimated dye on the lens.

27 Claims, 8 Drawing Sheets

METHOD OF DYEING PLASTIC LENS AND A DYEING SYSTEM USED THEREIN

BACKGROUND OF THE INVENTION

1. Field of the Invention

The present invention relates to a method of dyeing plastic lenses, in particular, spectacle lenses, and a dyeing system used in the dyeing method.

2. Description of Related Art

Heretofore, a dip dyeing method has been used in many cases to dye plastic lenses for spectacles. In this method, a dye solution is prepared by mixing dispersible dyes of three primary colors, i.e., red, blue, and yellow, and dispersing the mixture in water. The thus prepared dye solution is heated to about 90° C. A plastic lens is dipped in the heated dye solution, so that the lens is dyed.

As an alternative to the above dip dyeing method, a vapor deposition dyeing method has been proposed. This vapor-deposition dyeing method is carried out by heating a sublimatable dye to sublimate, thereby dyeing a plastic lens which is being heated.

In the above vapor-deposition dyeing method, the dyeing of lenses is effected by heating the sublimatable dye. As a result, a problem such as the disposal of waste solution after the dyeing will not arise. However, such the method has disadvantages that it is difficult to deposit dyes at a fixed quantity to adhere on a lens surface, to prepare dyes in desired density, and to dye lenses in a deep color. The hue or tint of a dye to be used is almost artificially prepared. As a result, the prepared dye is apt to be uneven in color, which will cause a large problem in quality control.

The conventional dip dyeing method mentioned above has also disadvantages that the interaction and condensation of the dispersible dyes cause variations and unevenness of hue or tint. This disables the stable provision of uniformly dyed objects. In addition, the dye solution after used has to be discharged finally, which causes a problem of disposal of waste solution and also prevents the effective use of dyes. In the dip dyeing method, furthermore, since the dye solution is heated, the dyeing work is carried out in the high-temperature and humidity environment, in which the foul smelling resulting from the dye is also present. The use of the dip dyeing method thus causes a deteriorated working environment.

SUMMARY OF THE INVENTION

The present invention has been made in view of the above circumstances and has an object to overcome the above problems and to provide a dyeing method capable of facilitating preparation of dyes in desired density and also dyeing plastic lenses with a stable hue or tint in every dyeing works, and improving a working environment thereof, and a dyeing system to be used for achieving the dyeing method.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the purpose of the invention, there is provided a method of dyeing a plastic lens, including a first step of printing a print area on a print base body with a dyeing solvent by using a printer electrically controlled, the dyeing solvent containing a dissolved or fine-grained dispersed sublimatable dye, a second step of placing the print base body having the print area printed with the dyeing solvent in a position where the print area faces a plastic lens to be dyed without contact therewith, and a third step of heating the print base body in a vacuum to sublimate the dye and deposit the sublimated dye on the lens.

According to another aspect of the present invention, there is provided a system for dyeing a plastic lens, including a printer which is electrically controlled to print a print area on a print base body with a dyeing solvent containing a dissolved or fine-grained dispersed sublimatable dye, a deposition device for heating the base body in a vacuum to sublimate the dye and deposit the sublimated dye on the lens to be dyed, the lens being placed in a position where the lens faces the print area printed on the base body without contact therewith.

In the present invention, a print base body having a print area formed with the dyes which can be easily prepared in a desired density is used to dye plastic lenses, so that the plastic lenses can be dyed in a desired density and a stable hue. Since the dyeing operation is conducted in a dry environment, the dyeing working environment can be also improved as compared with a conventional wet environment.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

A detailed description of preferred embodiments of a dyeing method and a dyeing system embodying the present invention will now be given referring to the accompanying drawings. In the following embodiments, the present invention is applied to spectacle plastic lenses.

Figure 5:
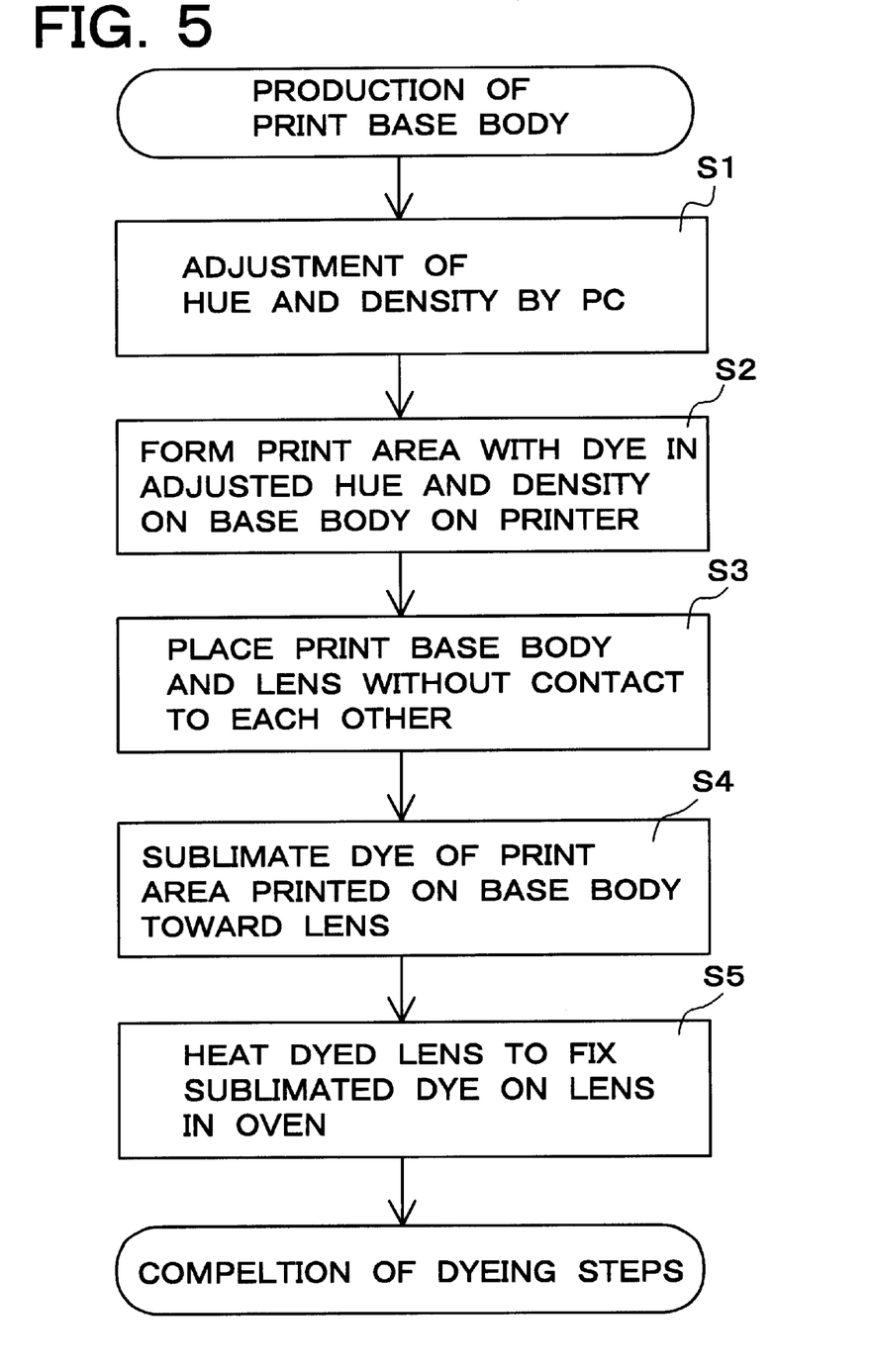
FIG. 5 is a flow chart of a dyeing method in the first embodiment according to the present invention.
Figure 6:
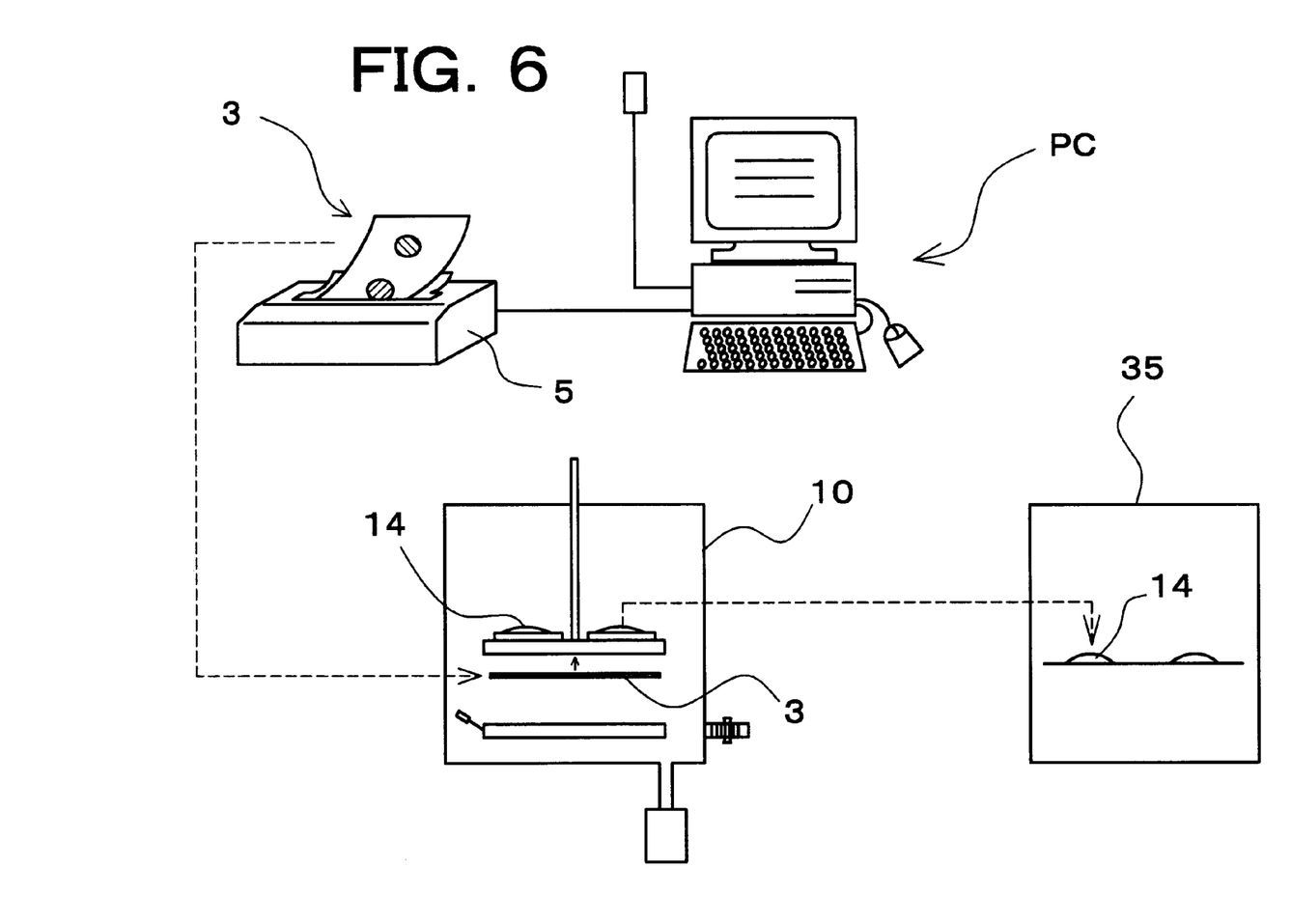
FIG. 6 is a schematic constructive view of a dyeing system for plastic lenses in the first embodiment according to the present invention.

In a first embodiment, the production of a print base body to be used for dyeing plastic lenses is first explained and then the dyeing of the plastic lenses is described. FIG. 5 shows a flow chart of the dyeing method in the first embodiment. FIG. 6 is a schematic view of the dyeing system including a dyeing device (jig) and others for carrying out the dyeing method shown in FIG. 5.

(1) Production of Print Base Body

Figure 1:
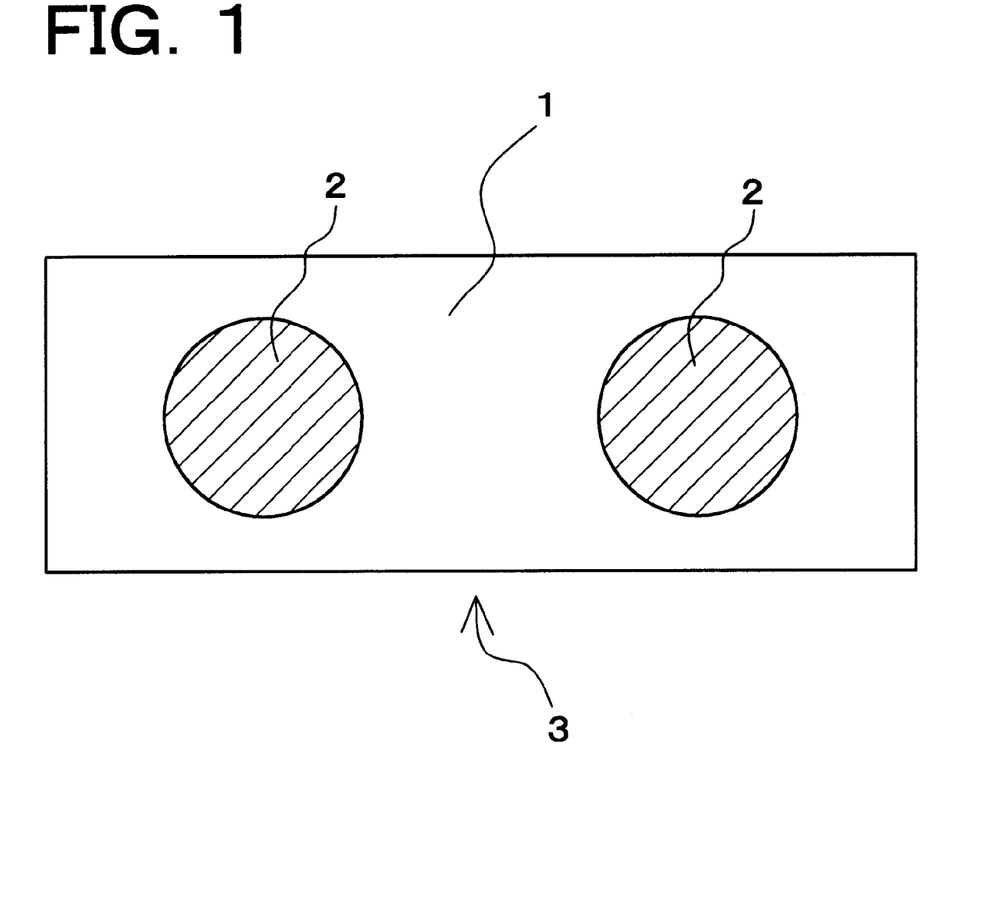
FIG. 1 is a schematic view of a print base body constructed of a white sheet of paper and colored areas (layers) printed thereon, which is used in a first embodiment according to the present invention.

A print base body 3 shown in FIG. 1 is produced in the following manner.

As a dyeing solvent (a sublimatable dye), four colors of water-base dispersible dye inks (manufactured by Upepo Co. Ltd.), i.e., red, blue, yellow, and black inks are used. The ink is prepared by dissolving or fine-grain dispersing a sublimatable dye in a solvent. Those inks are filled in respective ink cartridges and mounted in an ink jet printer 5 which is a commercially available one (manufactured by MIJ Co. Ltd.).

Subsequently, for outputting a print in a desired color on the ink jet printer, a commercially available personal computer (referred to as "PC" hereinafter) is used to produce the hue and density of the inks (S1). This production of hue is handled by a drawing software or computer color matching (CCM) in the PC. Accordingly, data on a desired color once produced can be stored in the PC, and prints in an identical color tone can be output a number of times if required. The color density is also digital-controlled by the PC, so that prints in an identical color density can also be output a number of times if required.

For a base body on which layers of the sublimatable dye are to be formed thereon, an A4-sized white paper 1 (high-quality PPC paper), commercially available, is used. This white paper 1 is set in the printer and subjected to the printing using the dye in the hue and density predetermined by the operation of the PC (S2). On the paper 1, circular colored layers 2 are formed as shown in FIG. 1. A print base body 3 is thus completed. In the present embodiment, two colored layers 2 are formed in pairs on the white paper 1. This is because the previously formation in pairs is more convenient for dyeing a pair of spectacle lenses, i.e., for a right and left lenses.

The diameter of the colored layer 2 is preferably determined to have a slightly larger than that of the lens to be dyed actually. Because the dye may not fully spread over the whole coloring surface of the lens if the diameter of the colored layer 2 is smaller than the lens diameter.

(2) Dyeing of Plastic Lenses

Figure 2:
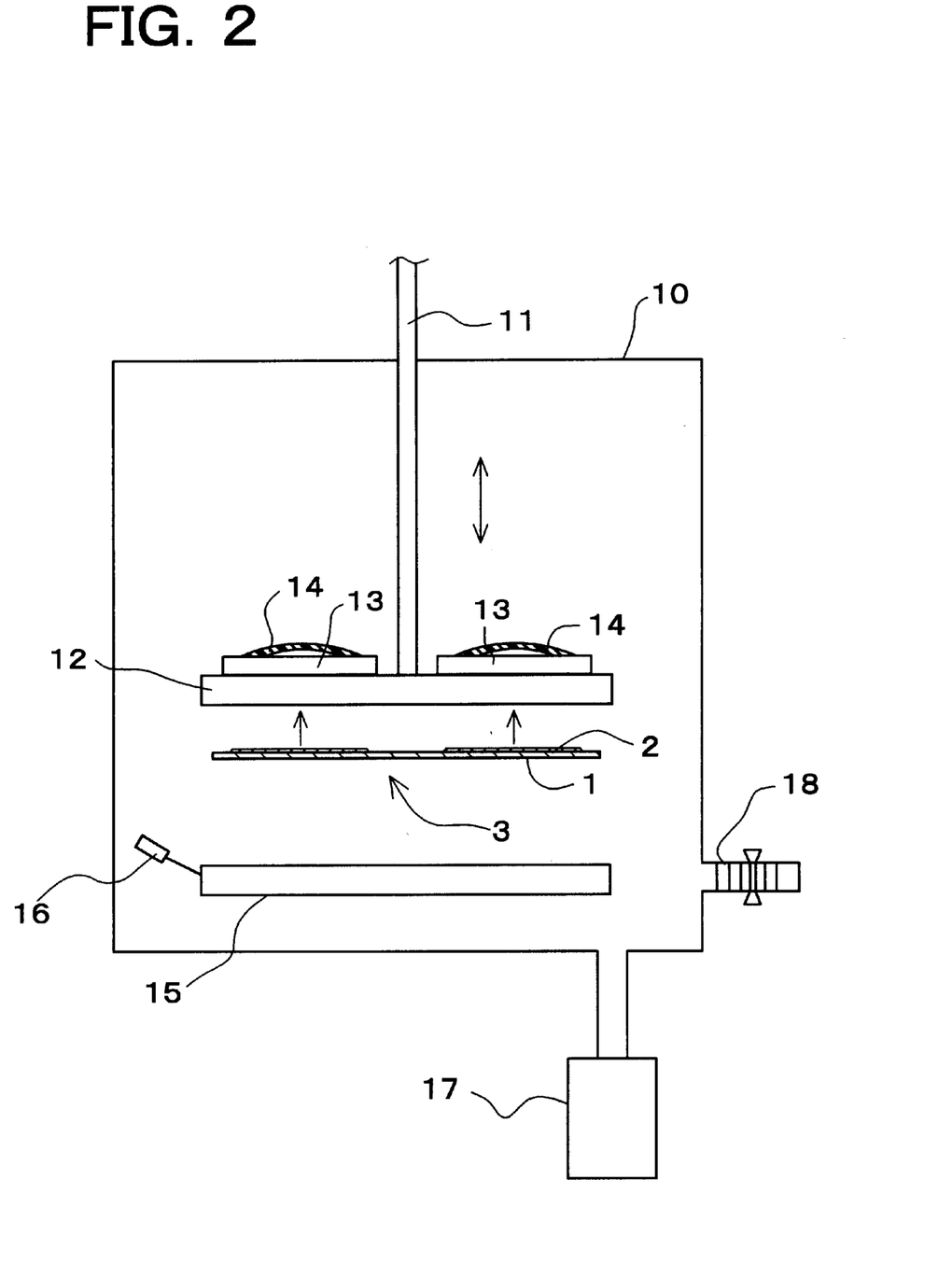
FIG. 2 is a schematic internal view of a vacuum vapor-deposition transfer device to be used in the first embodiment.

With the base body 3 produced as above, the dyeing of plastic lenses is effected as follows, using a vacuum vapor-deposition transfer device shown in FIG. 2 which is a schematic internal view of the device seen from its front side.

The vacuum vapor-deposition transfer device 10 is provided, at its front upper portion, with an opening not shown through which the print base body 3 and plastic lenses 14 are inserted into the device 10 or removed therefrom. Reference number 11 denotes a support shaft which functions to move a support plate 12 for holding thereon the lenses 14 in a vertical direction and in a horizontal direction between the opening and a dyeing position. The movement of the support plate 12 by the support shaft 11 enables mounting or dismounting of the lenses 14 on or from the support plate 12 through the opening. The support plate 12 has two circular holes 12a disposed symmetrically with respect to the support shaft 11, i.e., at a right and left sides thereof in FIG. 2. The circular hole 12a is designed to have a larger diameter than that of the lens to be mounted thereon. On the underside of the support plate 12, the print base body 3 (constructed of the white paper 1 with the colored layers 2 printed thereon) is attached so that the colored layers 2 are positioned on the upside of the body 3 and coaxially aligned with the holes 12a respectively, thereby to allow the dye of the colored layer 2 to sublimate toward the lens through the hole 12a.

Figure 3A:
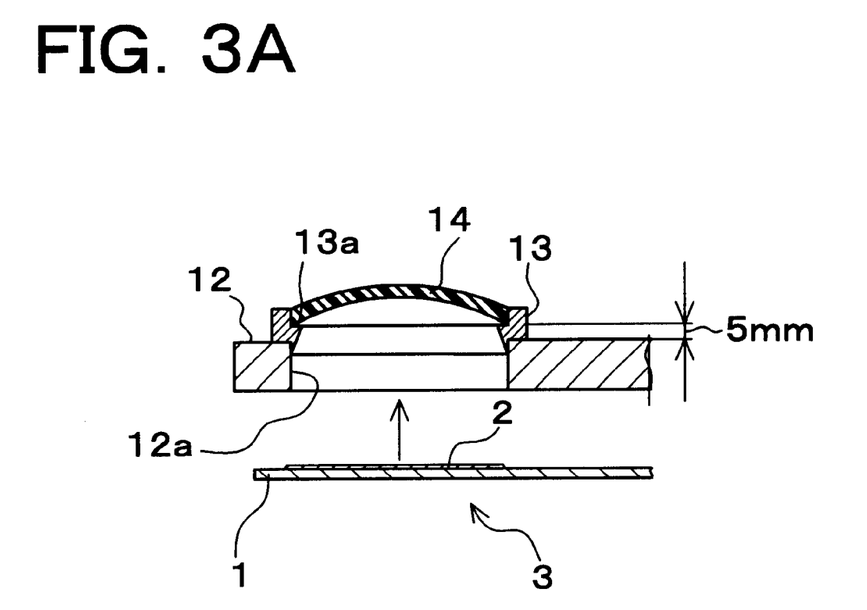
FIGS. 3A and 3B are sectional views of a part of a lens support plate with a (left) hole used in the first embodiment.

FIG. 3A is an enlarged view of a part of the support plate 12 with the hole 12a (a left one) in the first embodiment. A cylindrical lens holder 13 is joined with the support plate 12 so that the holder 13 is aligned with the hole 12a. This lens holder 13 is provided with, as shown in FIG. 3A, a lens holding groove 13a formed in a shape capable of holding the lens 14 to prevent the fall thereof. When the edge of the lens 14 is set in the lens holding groove 13a of the holder 13 joined with the support plate 12, the lens 14 can be held above the hole 12a.

Figure 3B:
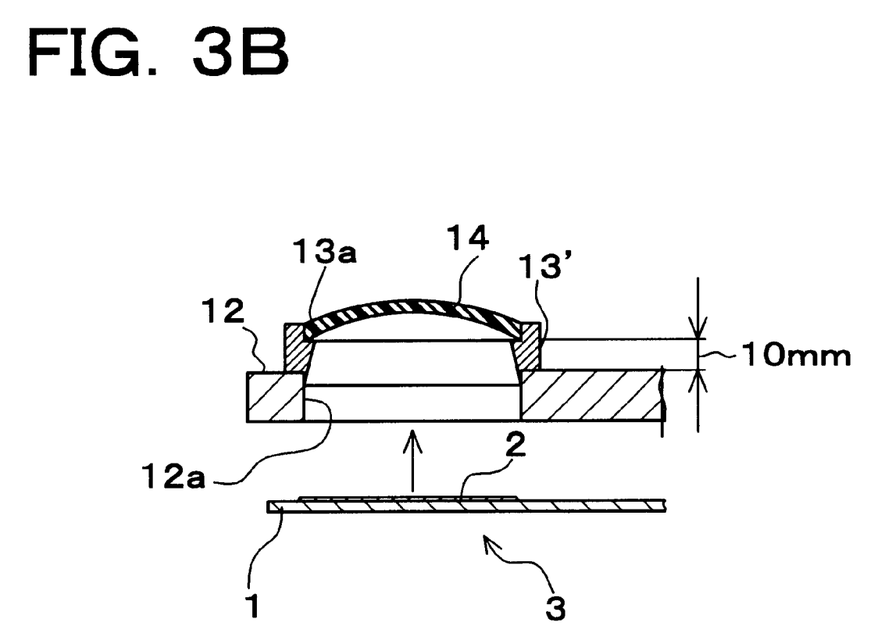

In the first embodiment, instead of the lens holder 13, another lens holder 13' having a different height shown in FIG. 3B may be used appropriately, whereby a distance from the print base body 3 to the lens 14 is changed, so that the dyeing density can be adjusted. In the present embodiment, six lens holders 13 of different heights are prepared so that the height can be adjusted in a range of 5–30 mm (in 5 mm steps). Even if the identical print base body 3 is used, for example, as the height of the lens holder 13 is higher, the amount of sublimated dye which will reaches the lens 14 is smaller. Accordingly, with the higher lens holder 13 selected, the lens 14 can be dyed in lighter (i.e., lower) color density.

The material of the plastic lens 14 is selected from polycarbonate resin (e.g., diethyleneglycol bis-allyl carbonate polymer (CR-39)), polyurethane resin, allyl resin (e.g., allyl diglycol carbonate and its copolymer, and diallyl phthalate and its copolymer), fumaric acid resin (e.g., benzyl fumarate copolymer), styrene resin, polymethyl acrylate resin, fibrid resin (e.g., cellulose propionate) and so on.

In the device 10, a heater 15 is disposed below the lens support plate 12 and serves to sublimate the dye of the layers 2 printed on the white paper 1. This heater 15 can be set to a desired temperature. The material of the heater 15 is aluminum which is high in thermal conductivity. By feeding current through a Nichrome wire not shown passing through the inside of the heater 15, the surface temperature of the heater 15 is increased. This surface temperature is detected by a temperature sensor 16 as to whether or not the temperature reaches a preset value.

A rotary vacuum pump 17 is connected to the device 10 and used to produce an almost vacuum in the device 10 for a dyeing operation. Reference numeral 18 denotes a leak valve provided to the device 10. This valve 18 is opened after the dyeing operation to take air into the device 10 maintained under vacuum, thereby to return it to an atmospheric pressure.

The vacuum vapor-deposition transfer device 10 configured as above is operated in the following manner to dye the plastic lens 14.

First, the support shaft 11 is operated to move the support plate 12 upward and move horizontally toward the opening formed at the front side of the device 10. Then, the print base body 3 produced in the above mentioned process (1) is inserted into the device 10 and attached, placing its print surface (with the colored layers 2) up, to the underside of the support plate 12 with an adhesive tape and the like so that the colored layers 2 are aligned with the two holes 12a of the support plate 12 respectively. After the attachment of the base body 3 to the support plate 12, the lens holders 13 are fitted on the upside of the support plate 12.

Subsequently, the plastic lenses 14 are set with the concave surface side down in the lens holders 13. The heater 15 is then heated to a desired heating temperature. In the present embodiment, the heating temperature of the heater 15 is preset in a range of 100–200° C. If the heating temperature is less than 100° C., the dye printed on the print base body 3 will not sublimate easily. If it is higher than 200° C., to the contrary, there are possibilities of deteriorating the quality of the dye or deforming the lens. Accordingly, the heating temperature of the heater 15 is preferably set in a range of 100–200° C., and, more preferably, it is set at as high a temperature as possible within the range according to the material of the plastic lenses 14.

The reason to set the heating temperature as high as possible for sublimation is that the higher temperature enables the reduction of the heating time needed for sublimating a dye in desired hue and density, and the increase of productivity in association therewith.

Next, the opening of the device 10 is closed and the rotary vacuum pump 17 is activated to produce a vacuum in the device 10, namely, to reduce the internal pressure of the device 10 to about 1–50 mmHg. There is no problem even if reducing the pressure lower than 1 mmHg, but a high-performance exhauster is needed in such cases. To the contrary, as the internal pressure of the device 10 is higher, the temperature required for dye sublimation is higher. Accordingly, the upper limit of the pressure is preferably 50 mmHg. The more preferable range of the pressure is 10 to 30 mmHg.

When the sensor 16 detects that the heater 15 has been heated to the predetermined temperature, the support shaft 11 is operated to move the support plate 12 down until the plate 12 comes into contact with the heater 15 (S3).

With the support plate 12 being held in contact with the heater 15, the base body 3 attached to the underside of the support plate 12 is heated by the heater 15 for the predetermined duration, e.g., 1–20 min. from the contact (S4). The sublimation of the dye applied on the base body 3 starts almost simultaneously with the contact to the heater 15. If the heating duration is less than 1 min., the dye is not enough sublimated to dye the plastic lens 14 in a predetermined color density. If the heating duration exceeds 20 min., the plastic lens 14 is apt to be transformed by the heating. Accordingly, the heating duration is preferably in a range of 1 to 20 min. and more preferably 3 to 10 min.

Upon completion of the heating, the leak valve 18 is opened to return the pressure of the device 10 to normal. The support shaft 11 is operated to move the support plate 12 up to the opening of the device 10, and the plastic lens 14 is taken out through the opening opened. The sublimated dye is deposited on the plastic lens 14, but it is apt to come off if left as it is. To avoid this, the plastic lens 14 is further heated in an oven 35 as shown in FIG. 6 under normal pressure to fix the deposited dye on the lens 14 (S5). Specifically, this process is carried out in the steps of first raising the temperature of the oven to a preset temperature which is as high as possible below the lens resistible temperature, heating the lens 14 in the oven 35 for the duration so predetermined as to provide the desired hue and density, and then taking the lens 14 out of the oven 35. This heating temperature in the present embodiment is in a range of 50° C. to 150° C. and the heating duration is in a range of 30 to 60 min.

In the first embodiment, the plastic lens 14 is dyed from below with the sublimated dye heated from below in the vacuum vapor-deposition transfer device 10. Alternatively, the lens 14 may be placed with the concave surface side up so that the concave surface is dyed from above with the sublimated dye.

Figure 4A:
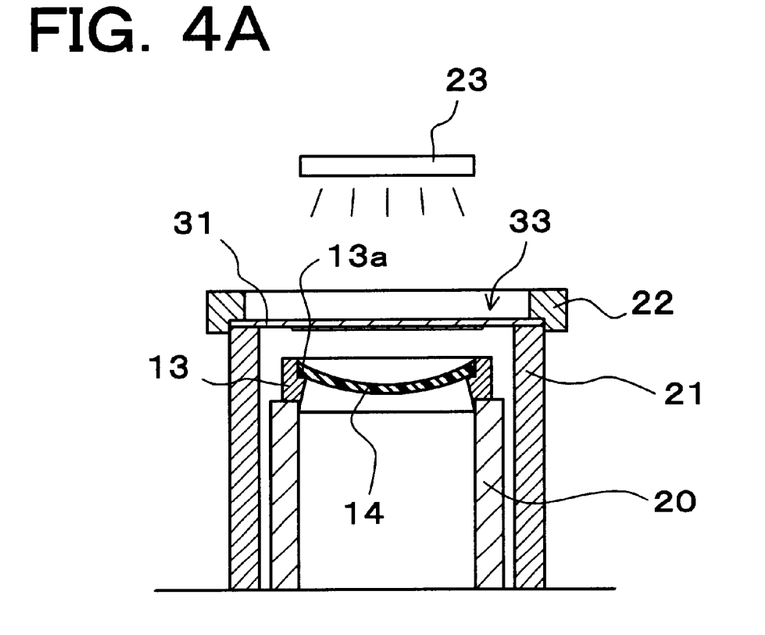
FIG. 4A is a cross sectional view of a dyeing jig used in a second embodiment according to the present invention.

This method of dyeing the lens from above is explained below in a second embodiment according to the present invention, referring to FIG. 4A. FIG. 4A is a schematic front sectional view of a dyeing jig used in the second embodiment. Like elements corresponding to those in the first embodiment are indicated by like numerals.

Reference numeral 20 denotes a cylindrical support stand, on which a lens holder 13 provided with a lens holding groove 13a is mounted. As shown in FIG. 4A, the holder 13 holds a plastic lens 14 placed with the convex surface side down by fitting the edge of the lens 14 in the lens holding groove 13a. The lens 14 is thus supported above the support stand 20.

Figure 4B:
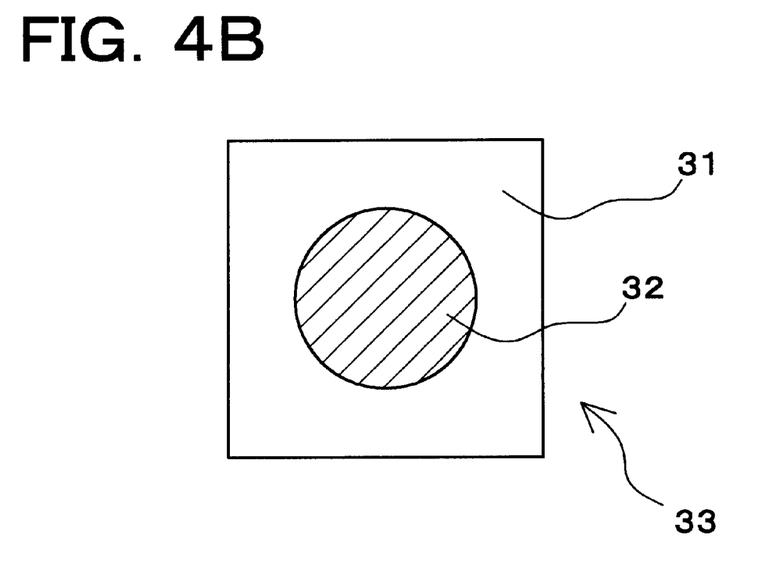
FIG. 4B is a schematic view of a print base body used in the second embodiment.

A print base body 33 constructed of a white paper 31 with a colored layer 32 printed thereon is easily produced by the use of a PC and a printer in the same manner as in the first embodiment. FIG. 4B is a plane view of the print base body 33. Reference numeral 21 denotes a cylindrical support stand for supporting a print base body 33, and 22 denotes a base body holder for securely holding the print base body 33 put on the upside of the support stand 21, thereby preventing the displacement of the base body 33. In this embodiment, the base body 33 is placed so that the surface on which the colored layer 32 is printed is on the underside to allow the dye of the layer 32 to sublimate downward. The plastic lens 14 is placed so that its concave surface side is not in contact with the lens holding groove 13a. Accordingly, the whole concave surface of the lens 14 can be dyed.

Reference numeral 23 denotes a halogen lamp which is disposed in a vacuum deposition device not shown and heats the base body 33 from above to sublimate the dye of the colored layer 32 formed on the base body 33.

Subsequently, with the above constructed dyeing jig, the following operation is carried out to sublimate the dye from the print base body 33 in a vacuum condition, similarly to the first embodiment, thereby to dye the plastic lens 14.

First, the stand 20 is put in the vacuum deposition device not shown, and the lens holder 13 is mounted on the stand 20. The plastic lens 14 is placed with the convex surface side down in the lens holding groove 13a of the lens holder 13. Thereafter, the cylindrical support stand 21 is disposed so as to enclose the lens support stand 20. The base body 33 is put on the support stand 21 as shown in FIG. 4A. The base body holder 22 is fitted on the upside of the support stand 21 to securely hold the base body 33 on the support stand 21, thereby preventing the displacement of the body 33.

After the set of the plastic lens 14 and the print base body 33 in the dyeing jig in the above manner, a rotary vacuum pump is used in the same manner as in the first embodiment to reduce the pressure of the vacuum deposition device to a predetermined pressure in a range of about 1–50 mmHg, preferably, 10–30 mmHg.

After detection on the predetermined vacuum pressure of the vacuum deposition device, the halogen lamp 23 is turned on to heat the print base body 33 until the surface temperature of the base body 33 reaches a predetermined temperature in a range of 100 to 220° C. When the surface temperature reaches the predetermined temperature, the halogen lamp 23 is turned off to terminate the heating. It is to be noted that turning off the halogen lamp 23 at this time is because in general the heat of a halogen lamp efficiently travels by radiation to an element being heated, i.e., the print base body 33 in the embodiment, and therefore, the dye sublimates simultaneously when the surface temperature of the base body 33 reaches the predetermined temperature.

Upon completion of the heating to the base body 33, the internal pressure of the vacuum deposition device is returned to normal, and the plastic lens 14 is taken out of the deposition device. Thereafter, the lens 14 is heated for the heating time, i.e., 30–60 min. and the heating temperature, i.e., 50–150° C., thereby to finish the fixing of the dye onto the plastic lens 14.

As described above, in the first and second embodiments, the dyeing of plastic lenses can be carried out in a dry working environment, not in a wet working environment caused by the conventional dip dyeing method. According to the present embodiments, the working environment can be improved, and workability can be also extremely improved. In addition, the preparation of inks is conducted under digital-control by the PC, so that the dye can be printed to the print base body at the amount always controlled. Accordingly, the dyeing method and the dyeing system used therein in the embodiments can reduce unevenness in the hue and density and provide the excellent effect for productions which are low in the volume and wide in the variety.

Furthermore, since the density of the dye to be printed on the print base body is controlled by the PC, the lens can be dyed in a desired density gradient without color unevenness and color missing.

Next, description is made on various examples using the dyeing method and system in the first and second embodiments according to the present invention.

EXAMPLE 1

In Example 1, the vacuum vapor-deposition transfer device 10 in the first embodiment is used as a dyeing jig. A CR-39 lens is used as the plastic lens 14 to be dyed. For a sublimatable ink, a water-base dispersible dye manufactured by UPEPO Co. Ltd. is used. By the use of a drawing software in the PC, the color data is produced such that the hue of the dye is brown color (the combination ratio of red, blue, and yellow equals to 2-1-3) and the color density is 30% (in a light-shield rate). Thereafter, two circular colored layers 2 each having a slightly larger diameter than the diameter of a lens to be dyed are printed on the white paper 1 (high-quality PPC paper) based on the color data produced as above, thus completing the print base body 3.

This print base body 3 is dried and then attached to the underside of the support plate 12 in the device 10 with an adhesive tape and the like. The lens holders 13 are mounted on the support plate 12 at respective positions of the holes 12a. Then, the plastic lenses 14 (CR-39) are set one-by-one in the lens holders 13 so that the concave surface of the lens 14 is in the underside. The lens holder 13 having a height of 15 mm is used in the present example. The heater 15 is turned on and its temperature is sensed by the temperature sensor 16. When the sensor 16 detects that the temperature of the heater 15 reaches 200° C., the rotary vacuum pump 17 is activated to reduce the internal pressure of the device 10 to 10 mmHg. Then, the support shaft 11 is operated to move the support plate 12 downward until the print base body 3 attached to the underside of the plate 12 comes into contact with the heater 15 to thereby start sublimation of the dye of the colored layers 2. The contact time between the base body 3 and the heater 5, i.e., the heating time, is 5 min.

After a lapse of the predetermined time (5 min.), the leak valve 18 is opened to return the pressure of the device 10 to a normal pressure. The dyed plastic lenses 14 are taken out of the device 10 and then put in the oven 35 at the heating temperature of 135° C. and for the heating time of 30 min., fixing the color (i.e., the deposited dye) on the plastic lenses 14. After this fixing, the dyed lenses 14 are visually checked as to whether the dyed color agrees with a desired color without inferior appearance, color unevenness, color missing. As a result of the visual observation, there is no defect in the above points.

EXAMPLE 2

The dyeing operation is carried out to dye plastic lenses in a (half) density gradient in the same dyeing conditions as in the Example 1.

The color data is produced by the PC such that the density gradient is adjusted to have the light shield rate of 30% at a point of 10 mm distant from the geometrical center of the lens. In the same way as in the Example 1, two circular colored layers 2 are printed on a white paper 1 to form a print base body 3. With this base body 3, the plastic lenses 14 are dyed to have a predetermined density gradient. The final plastic lenses 14 are excellent in colored conditions and no defect is visually observed regarding color evenness and others.

EXAMPLE 3

The same dyeing as in the Example 2 is carried out at each dyeing density in a range of 10% to 90% other than 30% to provide a whole colored plastic lens and other colored ones having different density gradients. No color unevenness and others are found in a visual check.

EXAMPLE 4

The dyeing jig (see FIG. 4A) described in the second embodiment is put in a vacuum deposition device in general use. A plastic lens 14 made of the same material as in the first embodiment is used. A print base body 33 and the plastic lens 14 are placed in respective positions in the dyeing jig. The rotary vacuum pump 17 is activated to reduce the internal pressure of the deposition device 10 to 10 mmHg. Subsequently, a halogen lamp 23 is turned on to heat the print base body 33 until its surface temperature reaches 210° C. When the surface temperature reaches 210° C., the halogen lamp is immediately turned off. The dye is sublimated toward and deposited on the plastic lens. The pressure of the device is then returned to normal. The plastic lens 14 taken out of the device is put in an oven 35 at 135° C. and for about 30 min. to fix the color (dye). After the fixing, a visual check is made as to appearance defects such as color unevenness, color missing, and others and whether the dyed color agrees with a desired color. Consequently, no problem is found in the above visual observation points.

EXAMPLE 5

By using the dyeing system in the first embodiment and selecting a gradient pattern in a drawing software in the PC, four print base bodies 50A–50D shown in FIGS. 7A–7D are produced, each having a colored layer printed in gradient (gradation) density on a white paper 40. The color (a combination of red(R), green(G), and blue(B)) of the colored layer 41 to be printed is prepared in the drawing software in the PC so that the color index numbers of R,G,B are 0, 255, 255.

In this example, the color combination is determined to (R,G,B)=(0,255,255), but not limited thereto and it may be appropriately selected to suit the needs or preferences.

Figure 7A:
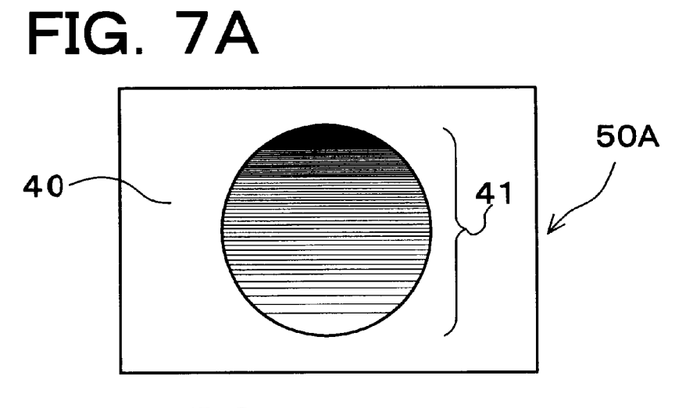
FIGS. 7A to 7D are schematic views of print base bodies produced in a fifth example.

The print base body 50A shown in FIG. 7A has a circular colored layer 41 printed on a white paper 40, based on the gradient pattern selected in the drawing software. This selected pattern is of gradually changing gradient density over all.

Figure 7B:
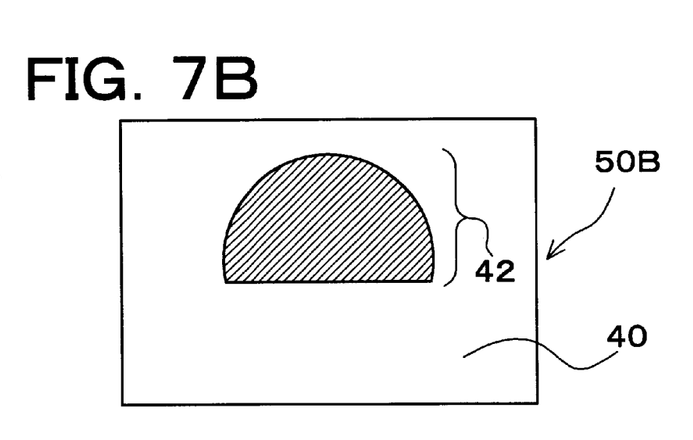

The print base body 50B shown in FIG. 7B has a substantially semicircular colored layer 42 on a white paper 40, the colored layer 42 is wholly constant in density. Specifically, the brightness is 255, the hue is 180, the color saturation is 255, each of which is one of 256 steps including 0 to 255.

Figure 7C:
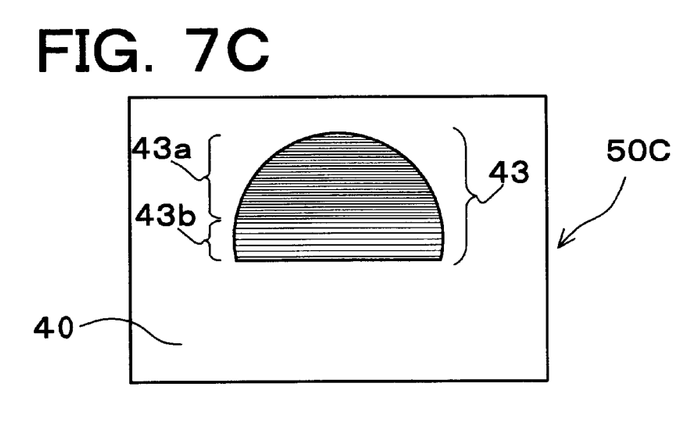

The print base body 50C shown in FIG. 7C has a substantially semicircular colored layer 43 on a white paper 40. The colored layer 43 is formed such that about two thirds of the layer 43 (corresponding to a colored layer 43a) is colored in constant density (the brightness is 255, the hue is 180, the color saturation is 255), and the remaining one-third (corresponding to a colored layer 43b) is colored in gradually changing gradient density.

Figure 7D:
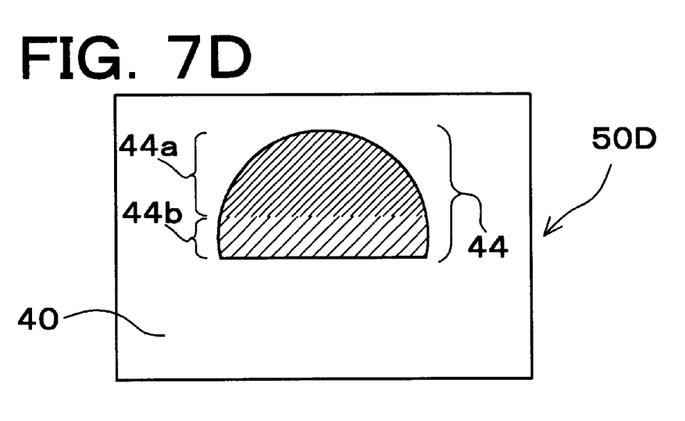

The print base body 50D shown in FIG. 7D has a substantially semicircular colored layer 44 on a white paper 40. The colored layer 44 is formed such that about two thirds of the layer 44 (corresponding to a colored layer 44a) is colored in dark density (the brightness is 255, the hue is 180, the color saturation is 255) and the remaining one-third (corresponding to a colored layer 44b) is colored in light density (specifically, the darkness is about half as compared with the colored layer 44a).

With the use of those print base bodies 50A–50D, plastic lenses 14 are dyed with the same dyeing jig as in the Example 4. The material of lenses and the dyeing conditions are the same as in the first embodiment. After dyeing, any color unevenness and other defects are not found in a visual check on the appearance of the lenses.

Furthermore, the transmittance of the plastic lenses 14 dyed using the print base bodies 50A–50D are measured. This measurement is carried out by measuring the transmittance at several points in 5 mm steps on the diametrical line of the lens, starting from one point near the outer bound of the lens (for example, one point in the darkest dyed portion in FIG. 7A).

Figure 8:
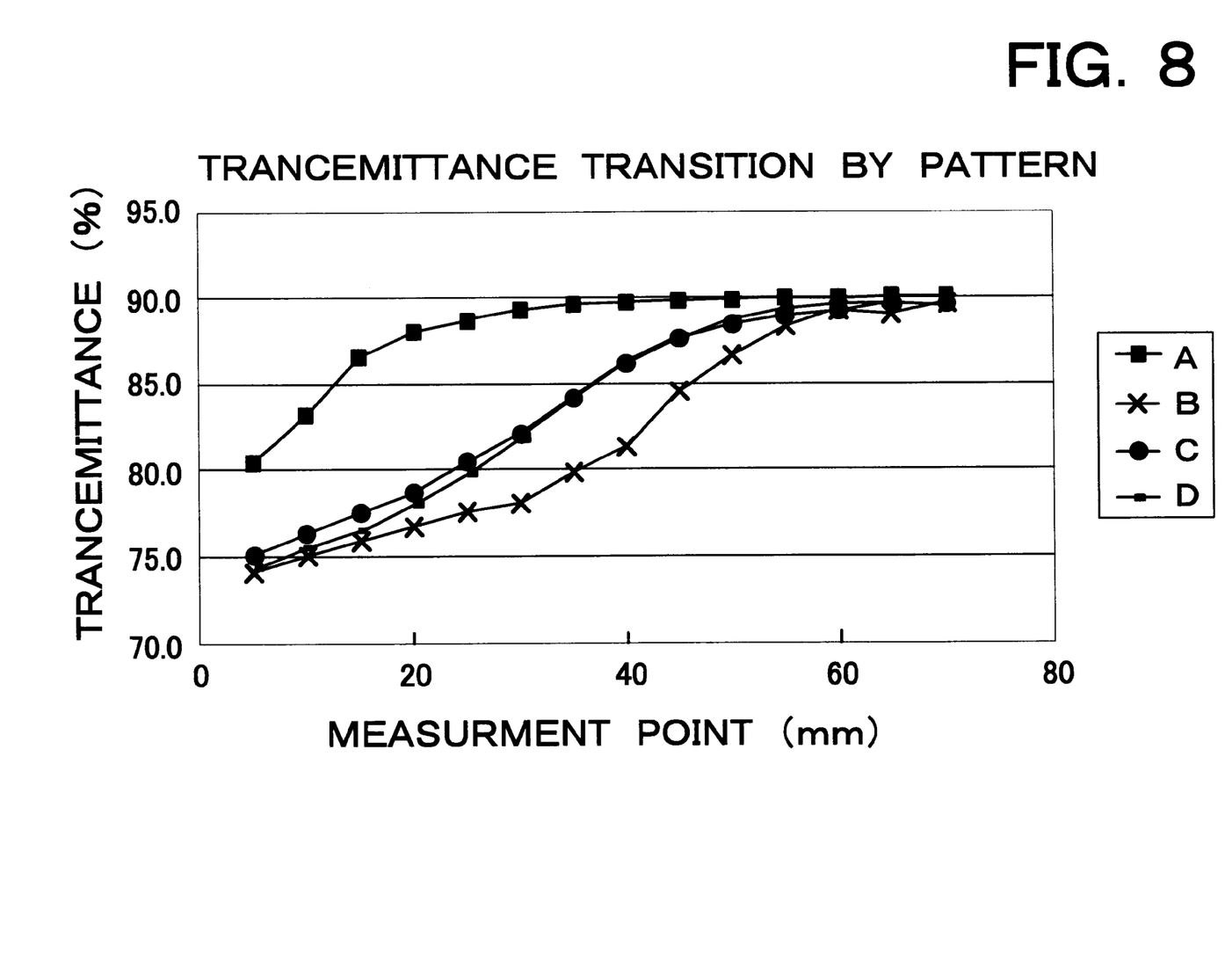
FIG. 8 is a graph showing the transmittance of lenses dyed using the print base bodies shown in FIGS. 7A–7D.

A measurement device used in this example is MODEL 304 manufactured by ASAHI SPECTRA CO., LTD. The measurement result is shown in FIG. 8 graphing transmittance transitions by pattern. The horizontal axis of the graph indicates the distance from the measurement start point and the vertical axis indicates the transmittance measured at each measurement point. It is to be noted that, as the color density of the dyed lens is lower, the transmittance is higher. Four lines A to D indicate the results of the lenses dyed by the use of the print base body 50A–50D, respectively. In the above manner, the plastic lenses 14 are dyed with respective gradient patterns by the use of the corresponding base body 50A–50D. As shown in the graph, for example, with the base body 50A, the lens 14 is dyed with the gradient pattern having a small part colored in dark density and providing a sudden change to light density. With the base bodies 50B, 50C, the lenses 14 are dyed with the gradient patterns having a constant density transition. With the base body 50D, the lens 14 is dyed with the gradient pattern having a large part colored in dark density and providing a sudden change to light density.

Although it is very difficult to conduct the dyeing with the fine gradient patterns by the conventional method, the dyeing method in the above embodiments according to the present invention enables to dye lenses with the fine gradient patterns.

Specifically, according to the present invention, even if required gradient patterns are different by lens, a lens can be dyed with an optional gradient pattern selected from among those shown in FIGS. 7A–7D or a gradient pattern of halftone between those gradient patterns.

The present invention may be embodied in other specific forms without departing from the spirit or essential characteristics thereof. For instance, although a water-base ink is used in the above embodiments, an oil-base ink can provide the same effect. In the case of the oil-base ink, which is apt to be dried in the head portion of an ink cartridge and may cause clogging of the head, a piezoelectric-type ink jet printer is preferably used.

In the above embodiments, although the heating to the print base body is conducted from above or below the base body, it may be carried out from side of the base body to sublimate the dye therefrom.

Furthermore, the ink jet type printer is used in the above embodiment to print out the color data, i.e., the colored layer on the print base body. Alternately, instead of the sublimation type printer and ink cartridges, a laser printer using toner cartridges or an output device which outputs the data from a PC such as a plotter and the like may be used.

Furthermore, since the color density can be digital-controlled by the PC, the same color can be read if the color which is frequently ordered is assigned in advance to a management number of color data. This makes it possible to retain the stability of the color to be printed and also to efficiently conduct the dyeing work.

As described above in detail, according to the present invention, the adjustment of color density to be provided to a plastic lens can be facilitated, and the lens can be dyed in a stable hue. In addition, the dyeing work can be carried out in a comfortable working environment without deterioration therein.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of dyeing a plastic lens for an eye, the lens having a curved surface, comprising:

inputting information on desired dyeing color and density to a computer which stores and controls color data, including dyeing color and density;

printing a print area on a print base body by controlling a printer, connected to the computer and supplied with a plurality of dyeing solutions each containing a dissolved or fine-grained dispersed sublimatable dye, to discharge the dyeing solutions in a jet based on the color data stored in and controlled by the computer and the information on the dyeing color and density input to the computer;

placing an edge of the lens to be dyed on a lens holding plane of a lens holder;

placing the lens to be dyed in a vacuum vapor-deposition device;

placing the print base body having the print area printed with the dyeing solutions in the vapor-deposition device so that the print area faces the curved surface of the lens to be dyed without contact therewith;

heating the print base body under vacuum in the vapor-deposition device, thereby sublimating the dye to vapor-deposit the sublimated dye on the curved surface of the lens;

taking the lens with the vapor-deposited dye out of the vapor-deposition device;

placing the lens with the vapor-deposited dye in an oven; and heating the lens with the vapor-deposited dye in the oven at temperatures below a lens resistible temperature to fix the dye to the lens.

2. The dyeing method according to claim 1, wherein the printing step includes printing the print area for a right eye lens and another print area for a left eye lens on the print base body to vapor-deposit the dye on a pair of lenses for right and left eyes.

3. The dyeing method according to claim 1, further comprising changing a distance between the print base body having the print area and the lens to be dyed.

4. The dyeing method according to claim 1, wherein the inputting step includes inputting data on gradient patterns to the computer, and the printing step includes printing the print area with a density gradient when the gradient data is input.

5. The dyeing method according to claim 1, wherein the lens with the vapor-deposited dye is heated in the oven to a temperature in a range of 50° C. to 150° C.

6. The dyeing method according to claim 1, wherein the print area is printed substantially in a circle on the print base body, the circular print area having a larger diameter than that of a dyeing area of the curved surface of the lens to be dyed.

7. The dyeing method according to claim 1, wherein the printer is an ink jet type printer.

8. The dyeing method according to claim 1, wherein the print base body is heated at a temperature in a range of 100° C. to 200° C. under vacuum in the vapor-deposition device.

9. A method of dyeing a plastic lens for an eye, the lens having a curved surface, comprising:

inputting information on desired dyeing color and density to a computer which stores and controls color data, including dyeing color and density;

printing a print area on a print base body by controlling a printer, connected to the computer and supplied with a plurality of dyeing solutions each containing a dissolved or fine-grained dispersed sublimatable dye, to print the print area set larger than a dye area of the lens having a curved surface to be dyed with the dyeing solutions based on the color data stored in and controlled by the computer and the information on the dyeing color and density input to the computer;

placing an edge of the lens to be dyed on a lens holding plane of a lens holder;

placing the lens to be dyed in a vacuum vapor-deposition device;

placing the print base body having the print area printed with the dyeing solutions in the vapor-deposition device so that the print area faces the curved surface of the lens to be dyed without contact therewith;

heating the print base body under vacuum in the vapor-deposition device, thereby sublimating the dye to vapor-deposit the sublimated dye on the curved surface of the lens;

taking the lens with the vapor-deposited dye out of the vapor-deposition device;

placing the lens with the vapor-deposited dye in an oven; and heating the lens with the vapor-deposited dye in the oven at temperatures below a lens resistible temperature to fix the dye to the lens.

10. The dyeing method according to claim 9, wherein the inputting step includes inputting data on gradient patterns to the computer, and the printing step includes printing the print are with a density gradient when the gradient data is input.

11. The dyeing method according to claim 9, further comprising changing a distance between the print base body having the print area and the lens to be dyed.

12. The dyeing method according to claim 9, wherein the printer is an ink jet type printer.

13. The dyeing method according to claim 9, wherein the print base body is heated at a temperature in a range of 100° C. to 200° C. under vacuum in the vapor-deposition device.

14. The dyeing method according to claim 9, wherein the lens with the vapor-deposited dye is heated in the oven to a temperature in a range of 50° C. to 150° C.

15. A method of dyeing a plastic lens for an eye, the lens having a curved surface, comprising:

inputting information on desired dyeing color and density to a computer which stores and controls color data, including dyeing color and density;

printing a print area on a print base body by controlling a printer, connected to the computer and supplied with a plurality of dyeing solutions each containing a dissolved or fine-grained dispersed sublimatable dye, to discharge the dyeing solution in a jet based on the color data stored in and controlled by the computer and the information on the dyeing color and density input to the computer;

placing an edge of the lens to be dyed on a lens holding plane of a lens holder;

placing the lens to be dyed in a vacuum vapor-deposition device;

placing the print base body having the print area printed with the dyeing solutions in the vacuum vapor-deposition device so that the print area faces the curved surface of the lens to be dyed without contact therewith;

heating the print base body under vacuum in the vapor-deposition device, thereby sublimating the dye to vapor-deposit the sublimated dye on the curved surface of the lens; and heating the lens with the vapor-deposited dye in the oven at temperatures below a lens resistible temperature to fix the dye to the lens.

16. The dyeing method according to claim 15, wherein the print area is printed substantially in a circle on the print base body, the circular print area having a larger diameter than that of a dyeing area of the curved surface of the lens to be dyed.

17. The dyeing method according to claim 15, wherein the printer is an ink jet type printer.

18. The dyeing method according to claim 15, wherein the lens with the vapor deposition dye is heated in an oven to a temperature in a range of 50° C. to 150° C.

19. The dyeing method according to claim 15, wherein the inputting step includes inputting data on gradient patterns to the computer, and the printing step includes printing the print area with a density gradient when the gradient data is input.

20. The dyeing method according to claim 15, further comprising changing a distance between the print base body having the print area and the lens to be dyed.

21. The dyeing method according to claim 15, wherein the print base body is heated at a temperature in a range of 100° C. to 200° C. under vacuum in the vapor-deposition device.

22. A method of dyeing a plastic lens for an eye, the lens having a curved surface, comprising:

inputting information on desired dyeing color and density to a computer which stores and controls color data, including dyeing color and density;

printing a print area on a print base body by controlling a printer, connected to the computer and supplied with a plurality of dyeing solutions each containing a dissolved or fine-grained dispersed sublimatable dye, to print the print area set larger than a dyeing area of the lens having a curved surface to be dyed with the dyeing solutions based on the color data stored in and controlled by the computer and the information on the dyeing color and density input to the computer;

placing an edge of the lens to be dyed on a lens holding plane of a lens holder;

placing the lens to be dyed in a vacuum vapor-deposition device;

placing the print base body having the print area printed with the dyeing solutions in the vacuum vapor-deposition device so that the print area faces the curved surface of the lens to be dyed without contact therewith;

heating the print base body under vacuum in the vapor-deposition device, thereby sublimating the dye to vapor-deposit the sublimated dye on the curved surface of the lens; and heating the lens with the vapor-deposited dye at temperature below a lens resistible temperature to fix the dye to the lens.

23. The dyeing method according to claim 22, wherein the inputting step includes inputting data on gradient patterns to the computer, and the printing step includes printing the print area with a density gradient when the gradient data is input.

24. The dyeing method according to claim 22, further comprising changing a distance between the print base body having the print area and the lens to be dyed.

25. The dyeing method according to claim 22, wherein the printer is ink jet type printer.

26. The dyeing method according to claim 22, wherein the print base body is heated at a temperature in a range of 100° C. to 200° C. under vacuum in the vapor-deposition device.

27. The dyeing method according to claim 22, wherein the lens with the vapor-deposited dye is heated in a oven to a temperature in a range of 50° C. to 150° C.

* * * * *

UNITED STATES PATENT AND TRADEMARK OFFICE
CERTIFICATE OF CORRECTION

PATENT NO. : 6,520,999 B1
DATED : February 18, 2003
INVENTOR(S) : Kenichi Kamata, Minoru Inuduka and Tetsuo Yamada It is certified that error appears in the above-identified patent and that said Letters Patent is hereby corrected as shown below:

Column 12,
Line 4, "are" should read -- area --.
Line 26, "solution" should read -- solutions --.
Line 44, after "dye", delete "in the oven".

Signed and Sealed this

Twenty-ninth Day of April, 2003

JAMES E. ROGAN
*Director of the United States Patent and Trademark Office*